(12) United States Patent
Rokugawa et al.

(10) Patent No.: US 7,119,617 B2
(45) Date of Patent: Oct. 10, 2006

(54) DIFFERENTIAL AMPLIFIER

(75) Inventors: Hiroyuki Rokugawa, Sagamihara (JP); Takuji Yamamoto, Hachioji (JP)

(73) Assignee: Fujitsu Limited, Kawasaki (JP)

( * ) Notice: Subject to any disclaimer, the term of this patent is extended or adjusted under 35 U.S.C. 154(b) by 182 days.

(21) Appl. No.: 10/913,538

(22) Filed: Aug. 9, 2004

(65) Prior Publication Data

US 2005/0104661 A1    May 19, 2005

(30) Foreign Application Priority Data

Aug. 7, 2003   (JP)   ............... 2003-288502
Jul. 20, 2004  (JP)   ............... 2004-211161

(51) Int. Cl.
  *H03F 3/45*   (2006.01)
  *H03F 3/04*   (2006.01)
(52) U.S. Cl. ..................... 330/253; 330/302
(58) Field of Classification Search ............ 330/253, 330/302
See application file for complete search history.

(56) References Cited

U.S. PATENT DOCUMENTS

| | | | |
|---|---|---|---|
| 3,597,639 A | * | 8/1971 | Harwood .......... 327/247 |
| 5,652,545 A | * | 7/1997 | Miyashita et al. ..... 330/269 |
| 5,995,819 A | * | 11/1999 | Yamaji et al. ........ 455/326 |
| 6,366,166 B1 | * | 4/2002 | Belot ............... 330/252 |
| 6,624,699 B1 | * | 9/2003 | Yin et al. ........... 330/260 |
| 2004/0066236 A1 | * | 4/2004 | Fujimoto et al. ...... 330/302 |
| 2005/0088233 A1 | * | 4/2005 | Miyashita et al. ..... 330/252 |
| 2005/0110571 A1 | * | 5/2005 | Imayama et al. ....... 330/254 |

FOREIGN PATENT DOCUMENTS

| | | | |
|---|---|---|---|
| JP | 2000-040925 | | 2/2000 |
| JP | 2005073234 A | * | 3/2005 |

* cited by examiner

*Primary Examiner*—Robert Pascal
*Assistant Examiner*—Krista M. Flanagan
(74) *Attorney, Agent, or Firm*—Arent Fox PLLC

(57) ABSTRACT

A differential amplifier suitably adapted to an ultra-high-speed signal transmitting apparatus. The differential amplifier includes a first inductor located between a differential transistor and a gate grounded transistor, an optional second inductor located between a load resistor and a power supply, and an optional third inductor located between a source follower transistor and an output terminal.

15 Claims, 22 Drawing Sheets

DIFFERENTIAL AMPLIFIER

BACKGROUND OF THE INVENTION

This application claims priority from Japanese Patent Application Serial No. 2003-288502 of Hiroyuki ROKUGAWA filed Aug. 7, 2003 and Japanese Patent Application 2004-211161 of Hiroyuki ROKUGAWA filed Jul. 20, 2004. The entirety of these patent applications are incorporated herein by reference.

FIELD OF THE INVENTION

The present invention relates to a differential amplifying circuit having a wide frequency characteristic, which may be suitably adapted to an ultra-high-speed signal transmission apparatus.

DESCRIPTION OF THE RELATED ART

In a typical data communication system of the related art, the transmitting and receiving data rate (bit rate) must be increased more and more to cope with increase in the total amount of data. This has led to transmitting/receiving circuits of remarkably wider frequency bands. In such ultra-high-speed signal transmission, an amplifying circuit ensuring wider frequency band for uniformly amplifying the signals covering the frequency range from a low frequency to a very high frequency is required. In general, a differential amplifying circuit that is resistive to noise resulting from the power supply and offset is also often used.

FIG. 1 is a circuit diagram illustrating an example of the differential amplifying circuit of the related art. In FIG. 1, the differential amplifying circuit 1 includes differential signal input terminals 2A, 2B, current control voltage input terminals 3, 4, a differential circuit 5, source follower circuits 6, 7, and differential signal output terminals 8, 9.

The differential circuit 5 includes differential transistors 10, 11 for conducting differential operation for an input differential signal, gate grounded transistors 12, 13 in which the gate thereof is grounded for the alternating current (AC) element, load resistors 14, 15, a power supply line 16 for supplying a power source voltage VDD (for example, 1.8 V), and current source transistors 17, 18 forming the power supply source.

As further shown in FIG. 1, the differential transistor 10 is connected to a differential signal input terminal 2A via the gate thereof and is connected to the source of the gate grounded transistor 12 via the drain thereof. The gate grounded transistor 12 is connected to the power supply line 16 via the gate thereof and is connected to one terminal of the load resistor 14 via the drain thereof. The load resistor 14 is connected to the power supply line 16 via the other terminal thereof.

The differential transistor 11 is connected to a differential signal input terminal 2B via the gate thereof and to the source of gate grounded transistor 13 via the drain thereof. The gate grounded transistor 13 is connected to the power supply line 16 via the gate thereof and to one terminal of load resistor 15 via the drain thereof. The load resistor 15 is connected to the power supply line 16 via the other terminal thereof.

The current source transistor 17 is connected to sources of the differential transistors 10, 11 via the drain thereof, to a current control voltage input terminal 3 via the gate thereof, and to the drain of the current source transistor 18 via the source thereof. The current source transistor 18 is connected to a current control voltage input terminal 4 via the gate thereof and is grounded via the source thereof.

As also shown in FIG. 1, the source follower circuits 6, 7 include source follower transistors 19, 20 and current source transistors 21, 22, 23, 24.

The source follower transistor 19 is connected to the power supply line 16 via the drain thereof, to the drain of the gate grounded transistor 12 via the gate thereof and to a differential signal output terminal 8 and to the drain of the current source transistor 21 via the source thereof.

The current source transistor 21 is connected to the current control voltage input terminal 3 via the gate thereof and to the drain of the current source transistor 22 via the source thereof. The current source transistor 22 is connected to the current control voltage input terminal 4 via the gate thereof and is grounded via the source thereof.

As shown in FIG. 1, the source follower transistor 20 is connected to the power supply line 16 via the drain thereof, to the drain of the gate grounded transistor 13 via the gate thereof, and to a differential signal output terminal 9 and the drain of the current source transistor 23 via the source thereof.

The current source transistor 23 is connected to the current control voltage input terminal 3 via the gate thereof and to the drain of the current source transistor 24 via the source thereof. The current source transistor 24 is connected to the current control voltage input terminal 4 via the gate thereof and is grounded via the source thereof.

FIG. 2 is a frequency characteristic diagram for the differential amplifying circuit of the related art illustrated in FIG. 1. A gain of lower frequency is set to be a normalized value (0 dB), as shown in FIG. 2. As also shown in FIG. 2, A1 is the frequency characteristic of the differential transistors 10, 11 of FIG. 1 (voltage/current conversion characteristic to the drain from the gate in the differential transistors 10, 11 of FIG. 1); B1 is the frequency characteristic of load resistors 14, 15 of FIG. 1 observed from the drains of the gate grounded transistors 12, 13 of FIG. 1 (current/voltage conversion characteristic of the inputs of the source follower circuits 6, 7 of FIG. 1); C1 is the frequency characteristic of the source follower circuits 6, 7 of FIG. 1 (voltage/voltage response characteristic to the differential signal output terminals 8, 9 of FIG. 1 from the inputs of the source follower circuits 6, 7 of FIG. 1); and D1 is the total frequency characteristic of the differential amplifying circuit of FIG. 1.

The graphical results shown in FIG. 2 are produced as a result of simulation conditions that include the differential transistors 10, 11 of FIG. 1, each comprising six NMOS transistors connected in parallel, each transistor having gate length 60 nm, and gate width 2 μm; gate grounded transistors 12, 13 of FIG. 1, each comprising five NMOS transistors connected in parallel, each transistor having gate length 60 nm, and gate width 2 μm; source follower transistors 19, 20 of FIG. 1, each comprising twelve NMOS transistors connected in parallel, each transistor having gate length 60 nm, and gate width 2 μm; and load resistors 14, 15 of FIG. 1, each having resistance value 200Ω. It is noted that the current source transistors 17, 18 and 21 to 24 of FIG. 1 do not affect high frequency characteristics.

The simulation results shown in FIG. 4 also include the same transistor parameters and resistance value.

As is apparent from FIG. 2, the frequency band of the differential amplifying circuit 1 of the related art illustrated in FIG. 1 is approximately 14.8 GHz. In the differential amplifying circuit 1 of the related art illustrated in FIG. 1, the total frequency characteristic D1, as shown in FIG. 2, is mainly produced by the frequency characteristic A1 of FIG.

2 for the differential transistors 10, 11, frequency characteristic B1 of FIG. 2 for the load resistors 14, 15, and frequency characteristic C1 of FIG. 2 for the source follower circuits 6, 7.

As further shown in FIG. 2, the frequency characteristic B1 of the load resistors 14, 15 of FIG. 1 has generally been designed to restrict the total frequency characteristic D1. The frequency characteristic B1 that restricts the total frequency characteristic D1 is obtained by appropriately choose resistance values of the load resistors 14, 15 of FIG. 1. Since the frequency characteristic D1 is mainly restricted by the frequency characteristic B1, the frequency characteristic D1 is not easily varied due to fluctuation of transistor characteristics of the differential transistors 10, 11 and the source follower transistors 19, 20 of FIG. 1.

However, when the frequency to be processed becomes high and an ultra-high-speed transmitting signal is used, the structure of the differential amplifying circuit of the related art illustrated in FIG. 1 can no longer process such a transmitting signal, even with the present semiconductor manufacturing process technology. Accordingly, a differential amplifying circuit in a circuit configuration having remarkably wider frequency characteristic is required.

FIG. 3 is a circuit diagram illustrating another example of a differential amplifying circuit 50 of the related art (for example, refer to Japanese Laid-Open Patent Publication No. 2000-040925, which is hereby incorporated by reference). The differential amplifying circuit 50 of FIG. 3 is provided with a differential circuit 25 in the circuit structure which is different from that of the differential circuit 5 provided in the differential amplifying circuit illustrated in FIG. 1. The differential amplifying circuit 50 of FIG. 3 is otherwise similar to the differential amplifying circuit 1 of FIG. 1.

As shown in FIG. 3, the differential circuit 25 is configured like the differential circuit 5 illustrated in FIG. 1, except for the structure of inductors 26, 27, which are inserted between the load resistors 14, 15 and the power supply line 16. Functionally, the differential amplifying circuit 50 of FIG. 3 generates the peaking characteristic to the load resistors 14, 15 by operation of the inductors 26, 27 located between the load resistors 14, 15 and the power supply line 16, and expands the total frequency band by expanding the frequency band of the load resistors 14, 15.

FIG. 4 is a frequency characteristic diagram of the differential amplifying circuit 50 of FIG. 3. A gain of lower frequency is set to be a normalized value (0 dB), as shown in FIG. 4. As further shown in FIG. 4, A2 indicates the frequency characteristic of the differential transistors 10, 11 of FIG. 3; B2 indicates the frequency characteristic of the load resistors 14, 15 of FIG. 3; C2 indicates the frequency characteristic of the source follower circuits 6, 7 of FIG. 3; and D2 indicates the total frequency characteristic of the differential amplifying circuit 50 of FIG. 3. For the graphical results shown in FIG. 4, inductances of the inductors 26, 27 of FIG. 3 are set to be 0.8 nH.

The differential amplifying circuit 50 of FIG. 3 is intended to expand the frequency band of the load resistors 14, 15, which limit the total frequency characteristic in the differential amplifying circuit 1 illustrated in FIG. 1. However, as is apparent from FIG. 4, the frequency characteristic A2 of the differential transistors 10, 11 of FIG. 3 and the frequency characteristic C2 of the source follower circuits 6, 7 of FIG. 3 restrict the total frequency characteristic D2. Therefore, a problem arises in that the total frequency characteristic D2 is easily varied due to fluctuation in the characteristics of the differential transistors 10, 11 and the source follower transistors 19, 20 of FIG. 3.

Considering the problems described above, there remains an unmet need in the related art to provide a differential amplifying circuit having a wide frequency characteristic that is wider than that of the related art, and more particularly to provide a differential amplifying circuit that has a frequency characteristic wider than that of the related art and does not easily vary in its total frequency characteristic due to fluctuation in the characteristics of the transistors used.

SUMMARY OF THE INVENTION

In order to attain the above advantage, as well as others, the present invention provides a differential amplifier suitably adapted to an ultra-high-speed signal transmitting apparatus. The differential amplifier in accordance with various embodiments of the present invention includes a first inductor located between a differential transistor and a gate grounded transistor, an optional second inductor located between a load resistor and a power supply, and an optional third inductor located between a source follower transistor and an output terminal.

In a first aspect of the present invention, a differential amplifier is provided comprising: a differential transistor; a first inductor having a first end and a second end, the first end being connected to a drain of said differential transistor; a gate grounded transistor having a source connected to the second end of said first inductor; a load resistor having a first end and a second end, the first end being connected to a drain of said gate grounded transistor; a second inductor connected between the second end of said load resistor and a power supply; a source follower transistor having a gate connected to the drain of said gate grounded transistor; and a third inductor connected between a source of said source follower transistor and an output terminal.

A second aspect of the present invention provides a differential amplifier comprising: a differential transistor; a first inductor having a first end and a second end, the first end being connected to a drain of said differential transistor; a gate grounded transistor having a source connected to the second end of said first inductor; a load resistor having a first end and a second end, the first end being connected to a drain of said gate grounded transistor; a second inductor connected between the second end of said load resistor and a power supply; and a source follower transistor having a gate connected to the drain of said gate grounded transistor, and a source connected to an output terminal.

A third aspect of the present invention provides a differential amplifier comprising: a differential transistor; a gate grounded transistor having a source connected to a drain of said differential transistor; a load resistor having a first end and a second end, the first end being connected to a drain of said gate grounded transistor; a first inductor connected between the second end of said load resistor and a power supply; a source follower transistor having a gate connected to the drain of said gate grounded transistor; and a second inductor connected between a source of said source follower transistor and an output terminal.

A fourth aspect of the present invention provides a differential amplifier comprising one of the above first to third aspects, and the transistors, the load resistors and the inductors are formed as distributed constant circuits.

Additional advantages and novel features of the invention will be set forth in part in the description that follows, and in part will become more apparent to those skilled in the art upon examination of the following or upon learning by practice of the invention.

DESCRIPTION OF THE PREFERRED EMBODIMENTS

Embodiments of the present invention will be explained below with reference to the diagrams. However, these embodiments are not intended to limit the technical scope of the present invention.

Figure 5:
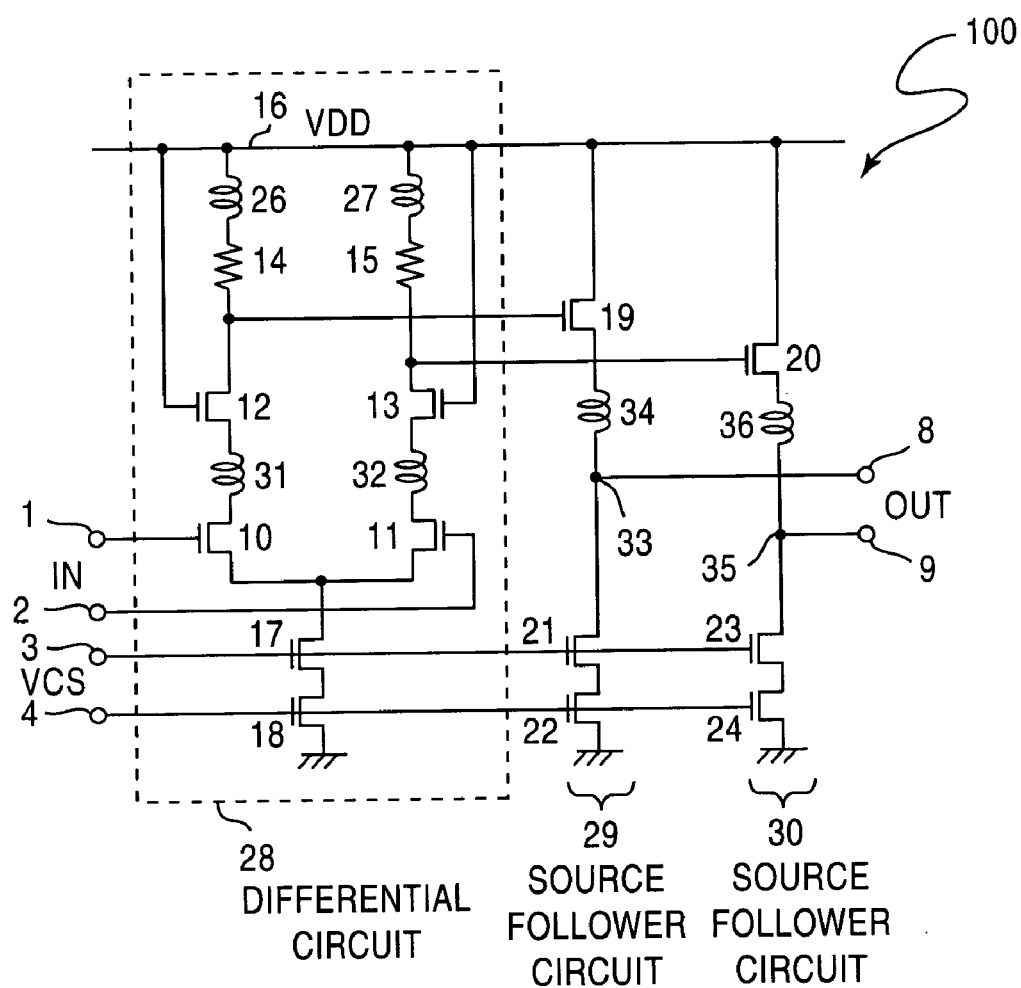
FIG. 5 shows a circuit diagram of a differential amplifying circuit in accordance with an embodiment of the present invention.

FIG. 5 shows a circuit diagram of a differential amplifying circuit 100 in accordance with an embodiment of the present invention. In this embodiment, a differential circuit 28 and source follower circuits 29, 30 are provided.

In the differential circuit 28, an inductor 31 is located between the drain of the differential transistor 10 and the source of the gate grounded transistor 12 (in the example circuit of FIG. 5, the gate of the gate grounded transistor 12 is connected to the power supply line 16), and an inductor 32 is located between the drain of the differential transistor 11 and the source of the gate grounded transistor 13.

In the source follower circuit 29, an inductor 34 is located between the source of source follower transistor 19 and the node 33 (connecting point of the source of the source follower transistor 19 and a differential signal output terminal 8).

In the source follower circuit 30, an inductor 36 is located between the source of the source follower transistor 20 and the node 35 (connecting point of the source of the source follower transistor 20 and a differential signal output terminal 9).

Figure 6:
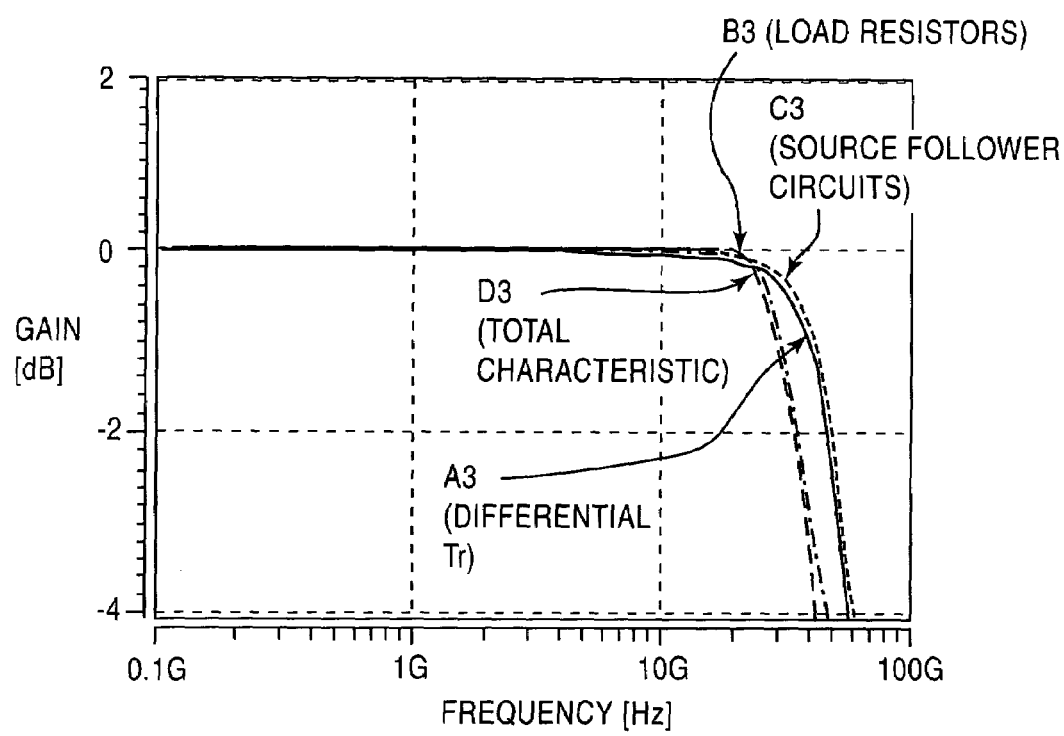
FIG. 6 is a frequency characteristic diagram for the differential amplifying circuit of FIG. 5.

FIG. 6 is a frequency characteristic diagram for the differential amplifying circuit of FIG. 5. In FIG. 6, A3 indicates the frequency characteristic of the differential transistors 10, 11 of FIG. 5 (voltage/current conversion characteristic to the drain from the gate of the differential transistors 10, 11 of FIG. 5); B3 indicates the frequency characteristic of load resistors 14, 15 of FIG. 5, observed from the drains of the gate grounded transistors 12, 13 of FIG. 5 (current/voltage conversion characteristic of the inputs of the source follower circuits 29, 30 of FIG. 5); C3 indicates the frequency characteristic of the source follower circuits 29, 30 of FIG. 5 (voltage/current conversion characteristic to the differential signal output terminals 8, 9 of FIG. 5 from the inputs of the source follower circuits 29, 30 of FIG. 5); and D3 indicates the total frequency characteristic of the differential amplifying circuit 100 of FIG. 5.

The graphical results shown in FIG. 6 are produced as a result of simulation conditions that include the differential transistors 10, 11 of FIG. 5, each comprising six NMOS transistors connected in parallel, each transistor having gate length 60 nm, and gate width 2 μm; gate grounded transistors 12, 13 of FIG. 5, each comprising five NMOS transistors connected in parallel, each transistor having gate length 60 nm, and gate width 2 μm; source follower transistors 19, 20 of FIG. 5, each comprising twelve NMOS transistors connected in parallel, each transistor having gate length 60 nm, and gate width 2 μm; and load resistors 14, 15 of FIG. 5, each having resistance value 200Ω. It is noted that the current source transistors 17, 18 and 21 to 24 of FIG. 5 do not affect high frequency characteristics.

The simulation results shown in FIGS. 8, 9, 10, 11, 13, 14, 15, 17, 18 and 19 also include the same transistor parameters and resistance values as those used in FIG. 5.

Figure 1:
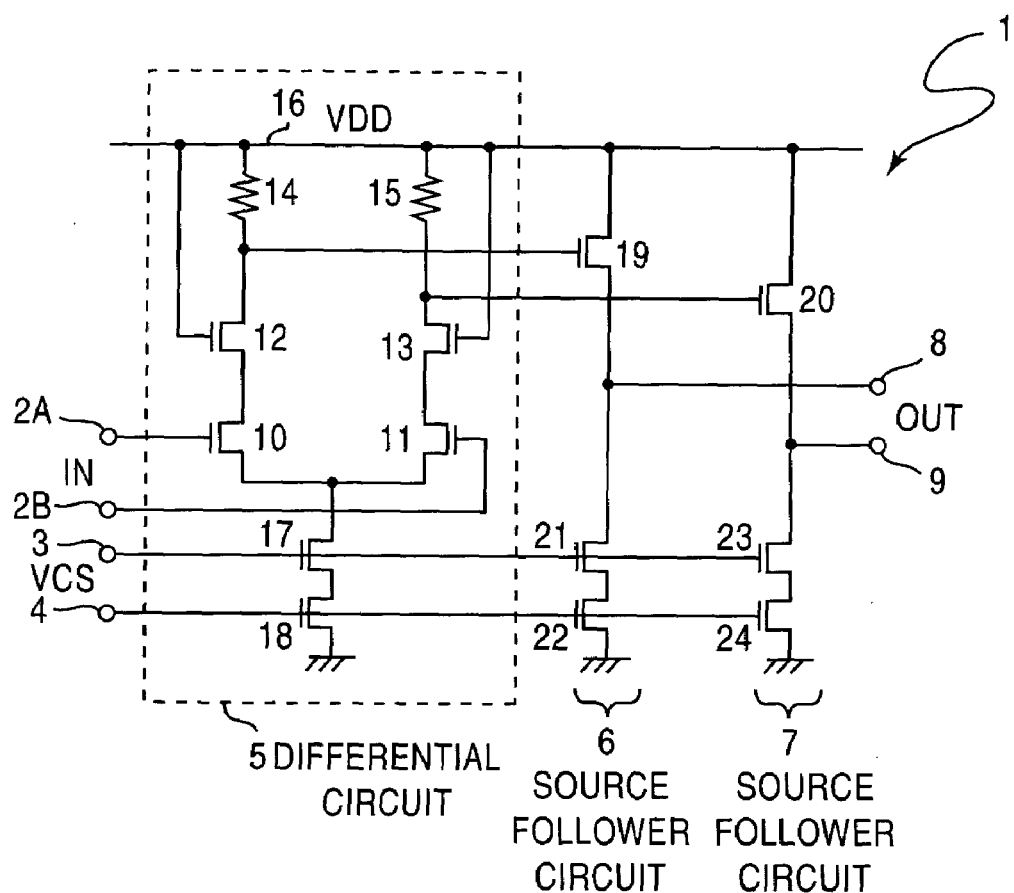
FIG. 1 shows a circuit diagram of an exemplary differential amplifying circuit of the related art.
Figure 2:
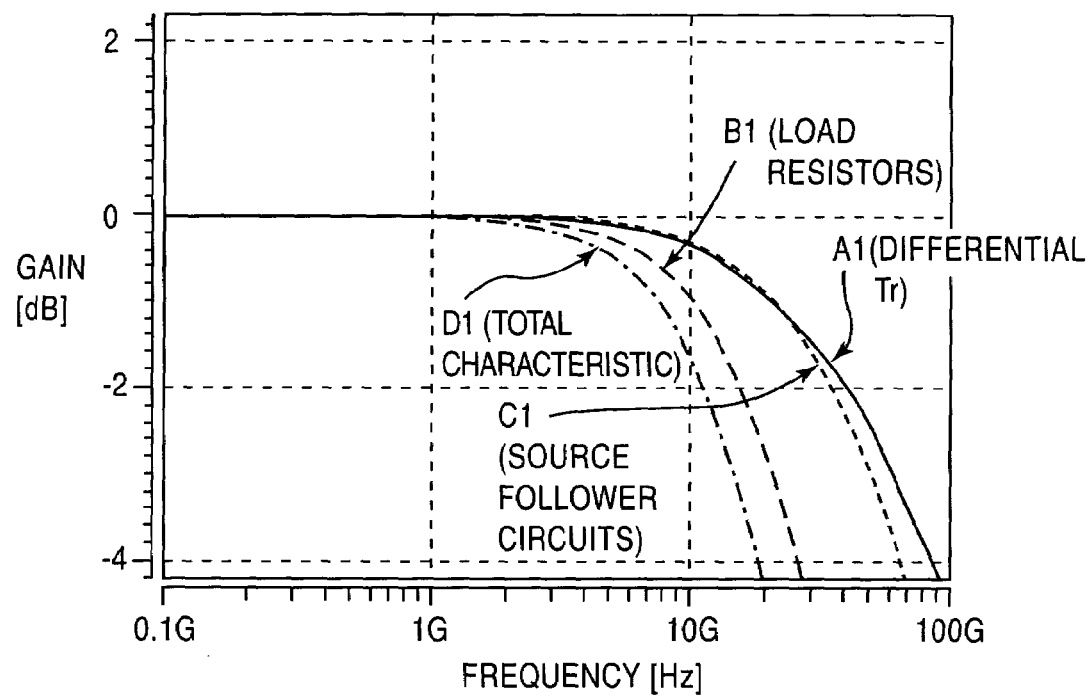
FIG. 2 is a frequency characteristic diagram for the differential amplifying circuit of FIG. 1.

The inductors are selected such that the inductance of each of the inductors 26, 27 shown in FIG. 5 is about 0.8 nH, the inductance of each of the inductors 31, 32 is about 0.55 nH, and the inductance of each of the inductors 34, 36 is about 0.15 nH. As shown in FIG. 6, the frequency bandwidth in the embodiment of the present invention shown in FIG. 5 is detected as about 34.8 GHz, as a result of simulation, which is wider than the bandwidth (14.8 GHz) of the differential amplifying circuit of related art illustrated in FIG. 1.

In the embodiment of FIG. 5, it is preferable to set the inductance values of the inductors 26 and 27 so as to lower the cut-off frequency associated with the load resistors 14, 15 relative to that of the differential transistors 10, 11 and that of the source follower circuits 29, 30. In this case, as shown in FIG. 6, the total frequency band characteristic D3 is limited by the frequency band characteristic B3 of the load resistors 14, 15 of FIG. 5. The total frequency band characteristic D3 is not limited by the frequency band characteristic A3 of the differential transistors 10, 11 of FIG. 5 or the frequency band characteristic C3 of the source follower circuits 29, 30 of FIG. 5. Therefore the total frequency band characteristic D3 is not easily varied due to fluctuation in the characteristics of the differential transistors 10, 11 and the source follower transistors 19, 20 of FIG. 5.

Moreover, it is also preferable that the gate widths of the gate grounded transistors 12, 13 of FIG. 5 be set such that the cut-off frequency of the load resistors 14, 15 is lower, than that of the differential transistors 10, 11 and that of the source follower circuits 29, 30, in order to extend the frequency band observed from the drain of the differential transistors 10, 11 by lowering the resistance values of the gate grounded transistors 12, 13 which is determined with inductors 31, 32, 34 and 36 assumed to be absent from the circuit 100.

In this case, the frequency band of the load resistors 14, 15 becomes narrow, but deterioration in the frequency band of the load resistors 14, 15 can be compensated via the presence of inductors 26, 27. Accordingly, such structure is preferable over the related art, from the point of view of restricting the total frequency band by the frequency band of the load resistors 14, 15.

Figure 3:
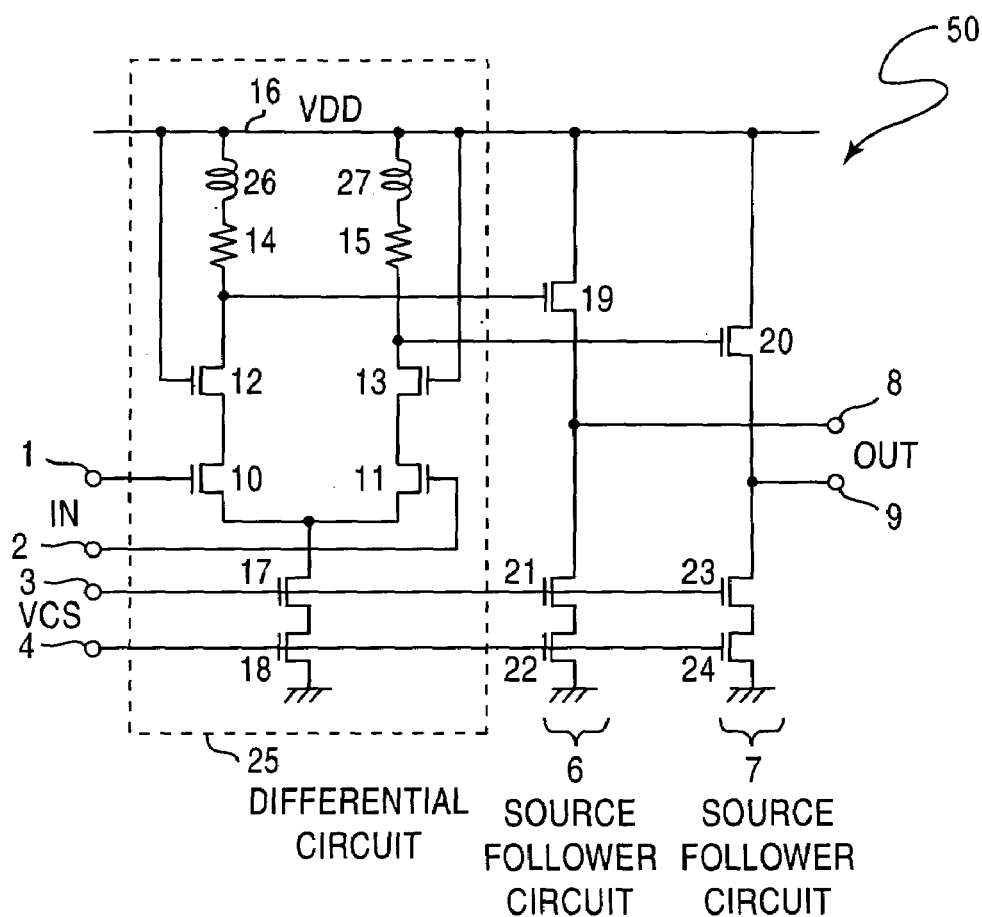
FIG. 3 shows a circuit diagram of another exemplary differential amplifying circuit of the related art.
Figure 4:
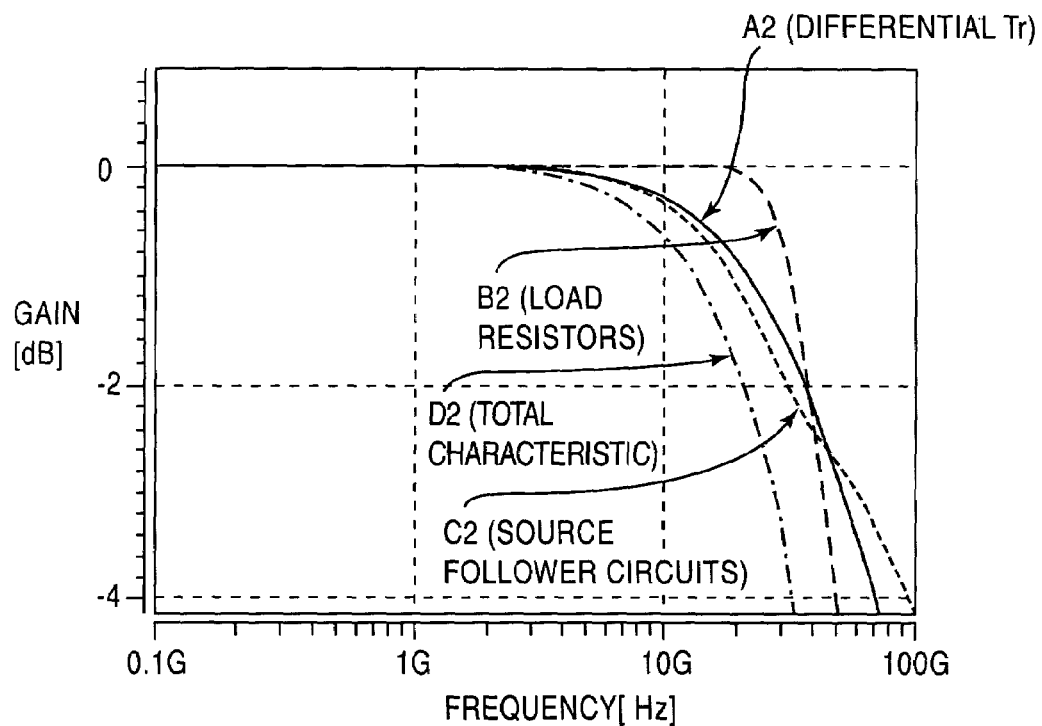
FIG. 4 is a frequency characteristic diagram for the differential amplifying circuit of FIG. 3.
Figure 7:
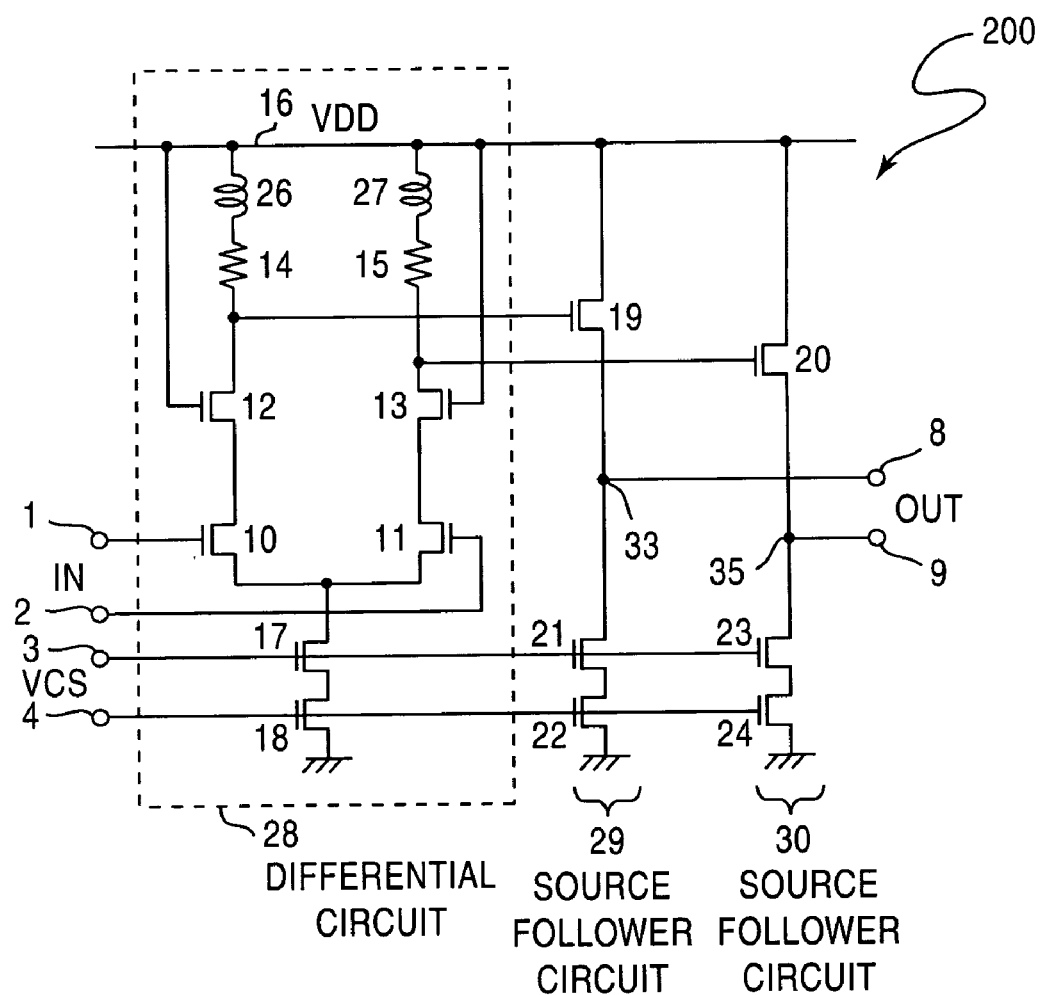
FIG. 7 shows a circuit diagram of a differential amplifying circuit for which varying circuit conditions are applied, in accordance with an embodiment of the present invention.

FIG. 7 is a circuit diagram of a differential amplifying circuit 200, in which inductors 26, 27 are located only between the load resistors 14, 15 and power supply line 16 (as in the related art shown in FIG. 3), but for which varying circuit characteristics are applied, in accordance with embodiments of the present invention.

Figure 8:
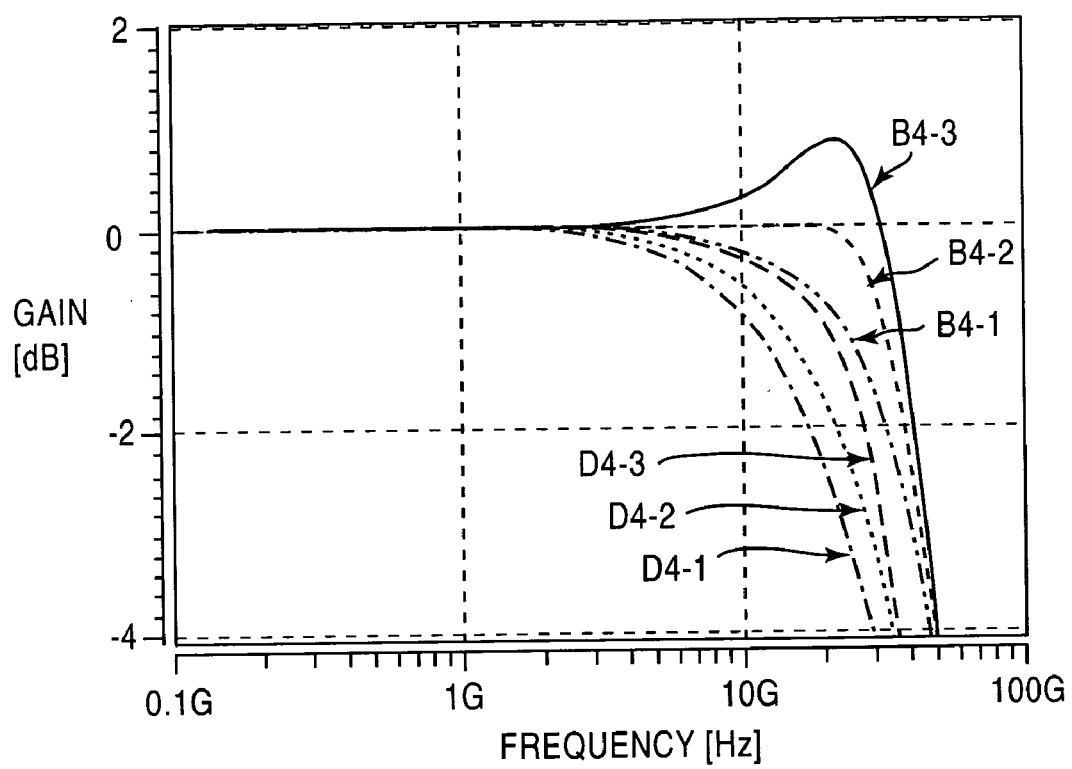
FIG. 8 is a frequency characteristic diagram for the differential amplifying circuit of FIG. 7, with inductance of the inductors 26, 27 of FIG. 7 being varied.

FIG. 8 is a frequency characteristic diagram for the differential amplifying circuit 200 of FIG. 7, with inductance of the inductors 26, 27 of FIG. 7 being varied. A gain of lower frequency is set to be a normalized value (0 dB) in FIG. 8. In FIG. 8, B4-1, B4-2, B4-3 indicate the frequency characteristics of load resistors 14, 15 of FIG. 7 viewed from the drains of the gate grounded transistors 12, 13 of FIG. 7. The characteristic B4-1 is obtained when the inductance of each of the inductors 26, 27 of FIG. 7 is about 0.6 nH, that for B4-2 when the inductance of each is about 0.8 nH, and that for B4-3 when the inductance of each is about 1.0 nH.

Moreover, D4-1, D4-2, D4-3 indicate the frequency characteristics of the differential amplifying circuit 200 as a whole. The characteristic D4-1 is obtained when the inductance of each of the inductors 26, 27 of FIG. 7 is about 0.6 nH, while D4-2 is obtained when the inductance of each is about 0.8 nH, and D4-3 is obtained when the inductance of each is about 1.0 nH.

Figure 9:
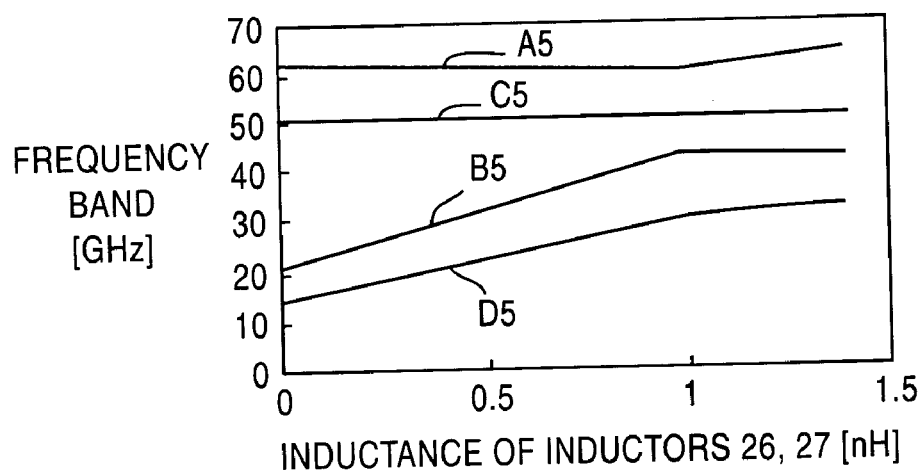
FIG. 9 is a diagram illustrating the relationship between inductance of inductors 26, 27 of FIG. 7 and frequency bandwidth for the differential amplifying circuit of FIG. 7.

FIG. 9 is a diagram illustrating the relationship between inductance of inductors 26, 27 of FIG. 7 and frequency bandwidth for the differential amplifying circuit 200 of FIG. 7. In FIG. 9, A5 indicates the bandwidth of the differential transistors 10, 11 of FIG. 7; B5 is the bandwidth of the load resistors 14, 15 of FIG. 7 viewed from the drains of the gate grounded transistors 12, 13 of FIG. 7; C5 is the frequency characteristic of the source follower circuits 29, 30 of FIG. 7; and D5 is the bandwidth of the differential amplifying circuit 200 as a whole.

Figure 10:
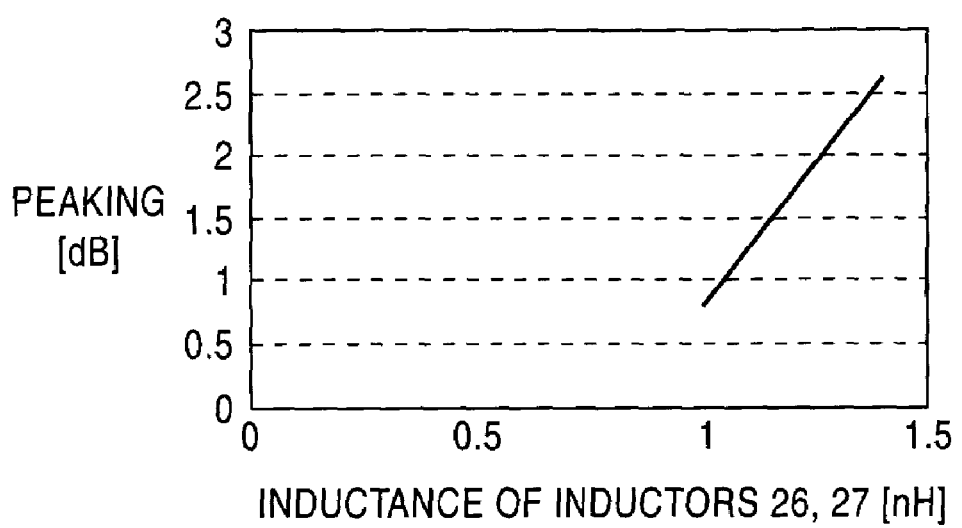
FIG. 10 is a diagram illustrating the relationship between inductance of inductors 26, 27 of FIG. 7 and the peaking on the total frequency characteristic for the differential amplifying circuit of FIG. 7.

FIG. 10 is a diagram illustrating the relationship between the inductance of the inductors 26, 27 of FIG. 7 and the peaking on the frequency characteristic of the differential amplifying circuit 200 of FIG. 7 as a whole.

As shown in FIG. 8 and FIG. 9, since the bandwidth B4-1, B4-2, B4-3, B5 of the load resistors 14, 15 of FIG. 7 restricts the total bandwidth D4-1, D4-2, D4-3, D5, the inductors 26, 27 of FIG. 7 considerably spread the total bandwidth D4-1, D4-2, D4-3, D5. However, as shown in FIG. 10, since a peaking characteristic appears in the total frequency characteristic when the inductance of the inductors 26, 27 of FIG. 7 is set to about 1 nH or higher, it is preferred that the inductance of the inductors 26, 27 of FIG. 7 not be set to a value considerably larger than 1 nH.

Figure 11:
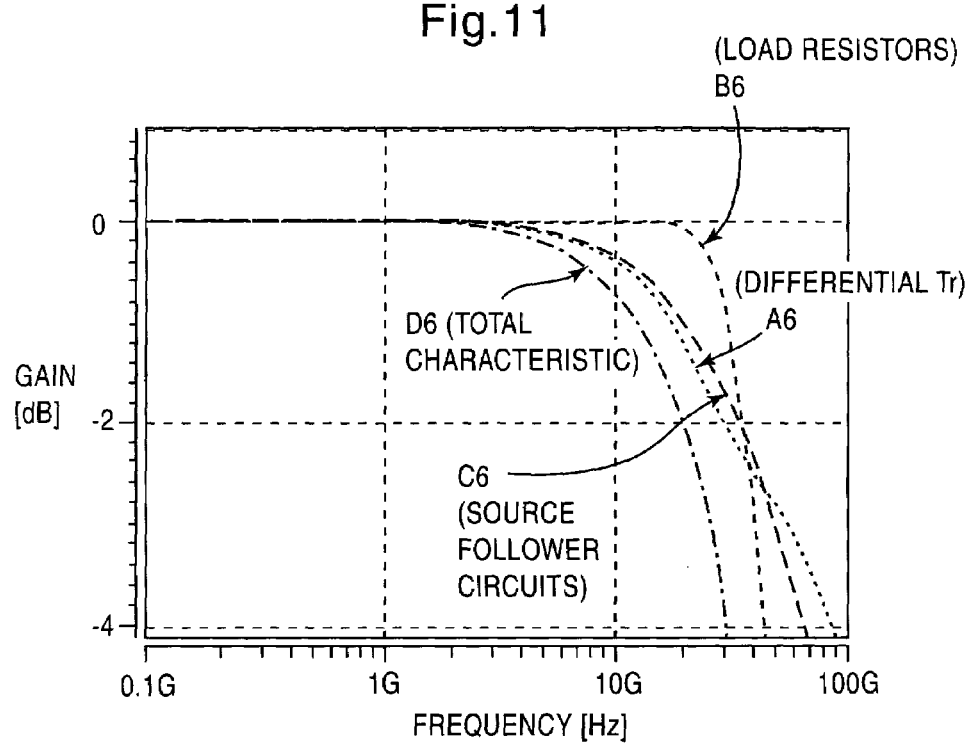
FIG. 11 is a frequency characteristic diagram for the differential amplifying circuit of FIG. 7, with inductance of the inductors 26, 27 of FIG. 7 being about 0.8 nH.

FIG. 11 is a frequency characteristic diagram for the differential amplifying circuit 200 of FIG. 7, inductance of the inductors 26, 27 of FIG. 7 being set to about 0.8 nH. A gain of lower frequency is set to be a normalized value (0 dB) in FIG. 11. In FIG. 11, A6 is the frequency characteristic of the differential transistors 10, 11 of FIG. 7; B6 is the frequency characteristic of the load resistors 14, 15 of FIG. 7 viewed from the drains of the gate grounded transistors 12, 13 of FIG. 7; C6 is the frequency characteristic of the source follower circuits 29, 30 of FIG. 7; and D6 is the frequency characteristic of the differential amplifying circuit 200 of FIG. 7 as a whole.

In FIG. 11, since the frequency characteristic B6 of the load resistors 14, 15 of FIG. 7 is spread toward the high frequency region, the cut-off point of the frequency characteristic A6 of the differential transistors 10, 11 of FIG. 7 nears that of the frequency characteristic B6 of the load resistors 14, 15 of FIG. 7. Therefore the total frequency characteristic D6 of the differential amplifying circuit 200 of FIG. 7 is restricted in accordance with the frequency characteristic of the differential transistors 10, 11 of FIG. 7.

Accordingly, when the frequency characteristic B6 of the load resistors 14, 15 of FIG. 7 is extended, as shown in FIG. 11, by locating the inductors 26, 27 as indicated FIG. 7, the frequency characteristic A6 of the differential transistors 10, 11 of FIG. 7 also should be extended. Hence results demonstrate the need to locate the inductors 31, 32, as shown in FIG. 5, between the drains of the differential transistor 10, 11 and the sources of the gate grounded transistor 12, 13, so as to extend the frequency characteristic A6 of the differential transistors 10, 11 of FIG. 7.

For the same reason, the frequency characteristic C6 of FIG. 11 of the source follower circuits 29, 30 of FIG. 7 also should be extended. Hence, these results also demonstrate the necessity to locate the inductors 34, 36, as shown in FIG. 5, between the source of the source follower transistor 19, 20 and an output terminal 8, 9, so as to extend the frequency characteristic C6 of the source follower circuits 29, 30 Of FIG. 7.

Figure 12:
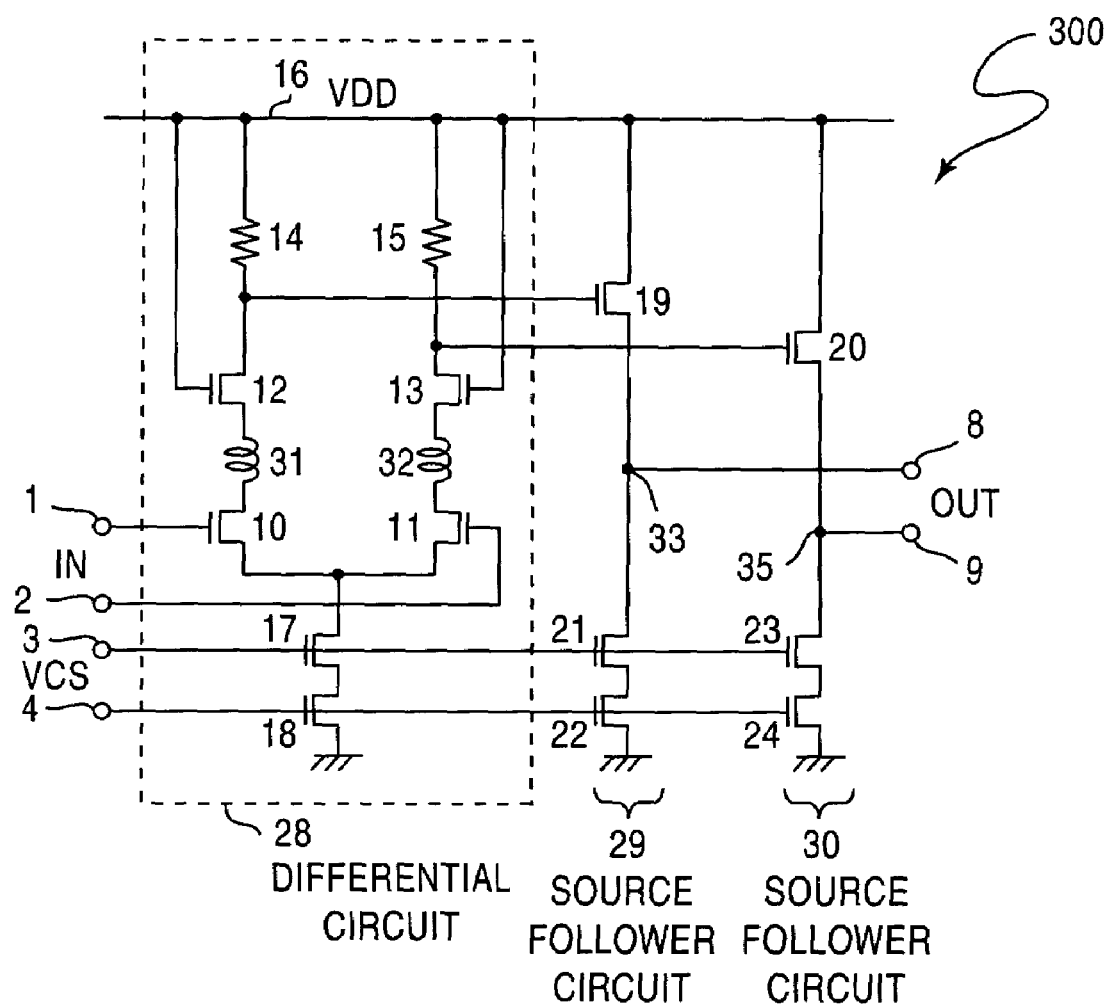
FIG. 12 shows a circuit diagram of a differential amplifying circuit, in accordance with the present invention, in which inductors are inserted only between the drain of differential transistor and the source of the gate grounded transistor.

FIG. 12 is a circuit diagram of a differential amplifying circuit 300, in which inductors 31, 32 are located only between the drain of differential transistor 10, 11 and the source of the gate grounded transistor 12, 13.

Figure 13:
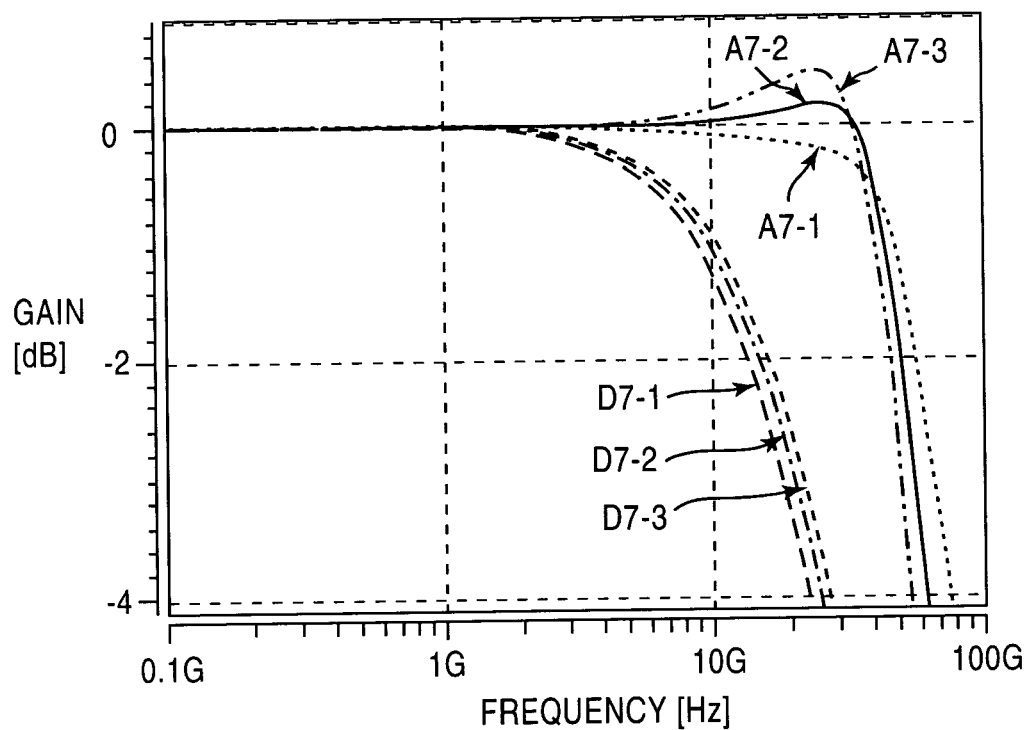
FIG. 13 is a frequency characteristic diagram for the differential amplifying circuit of FIG. 12, with inductance of the inductors 31, 32 of FIG. 12 being varied.

FIG. 13 is a frequency characteristic diagram for the differential amplifying circuit 300 of FIG. 12, with inductance of the inductors 31, 32 of FIG. 12 being varied. A gain of lower frequency is set to be a normalized value (0 dB) in FIG. 13. In FIG. 13, A7-1, A7-2, A7-3 are frequency characteristics of the differential transistors 10, 11 of FIG. 12. A7-1 is the characteristic when the inductance of each of the inductors 31, 32 of FIG. 12 is about 0.4 nH; A7-2 is the characteristic when the inductance of each is about 0.55 nH; and A7-3 is the characteristic when the inductance of each is about 0.7 nH.

Moreover, D7-1, D7-2, and D7-3 are total characteristics of the differential amplifying circuit 300 of FIG. 12. D7-1 is the characteristic when the inductance of each of the inductors 31, 32 of FIG. 12 is about 0.4 nH; D7-2 is the characteristic when the inductance of each is about 0.55 nH; and D7-3 is the characteristic when the inductance of each is about 0.7 nH.

Figure 14:
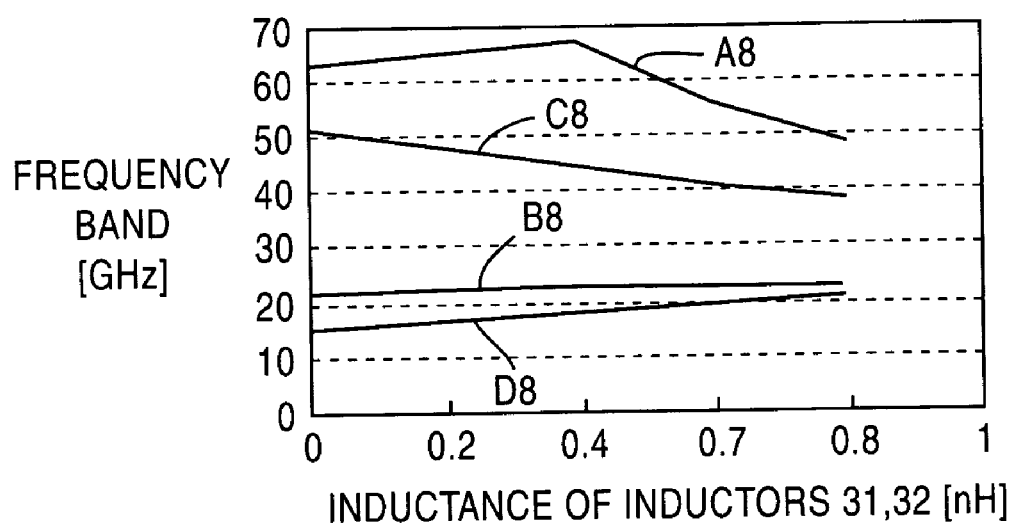
FIG. 14 is a diagram illustrating the relationship between inductance of inductors 31, 32 of FIG. 12 and frequency bandwidth for the differential amplifying circuit of FIG. 12.

FIG. 14 is a diagram illustrating the relationship between inductance of inductors 31, 32 of FIG. 12 and frequency bandwidth for the differential amplifying circuit 300 of FIG. 12. In FIG. 14, A8 is the bandwidth of the differential transistors 10, 11 of FIG. 12; B8 is the bandwidth of the load resistors 14, 15 of FIG. 12 viewed from the drains of the gate grounded transistors 12, 13 of FIG. 12; C8 is the frequency characteristic of the source follower circuits 29, 30 of FIG. 12; and D8 is the total bandwidth of the differential amplifying circuit 300 of FIG. 12.

As is apparent from FIG. 13 and FIG. 14, the bandwidth A8 of the differential transistors 10, 11 of FIG. 12 is extended in this example, and the total bandwidth D8 is restricted by the bandwidth B8 of the load resistors 14, 15 of FIG. 12. Here, the optimum value of the inductance of each of the inductors 31, 32 of FIG. 12 is between about 0.4 and 0.6 nH, when the frequency characteristic of FIG. 13 and the total bandwidth characteristic of FIG. 14 are considered.

Figure 15:
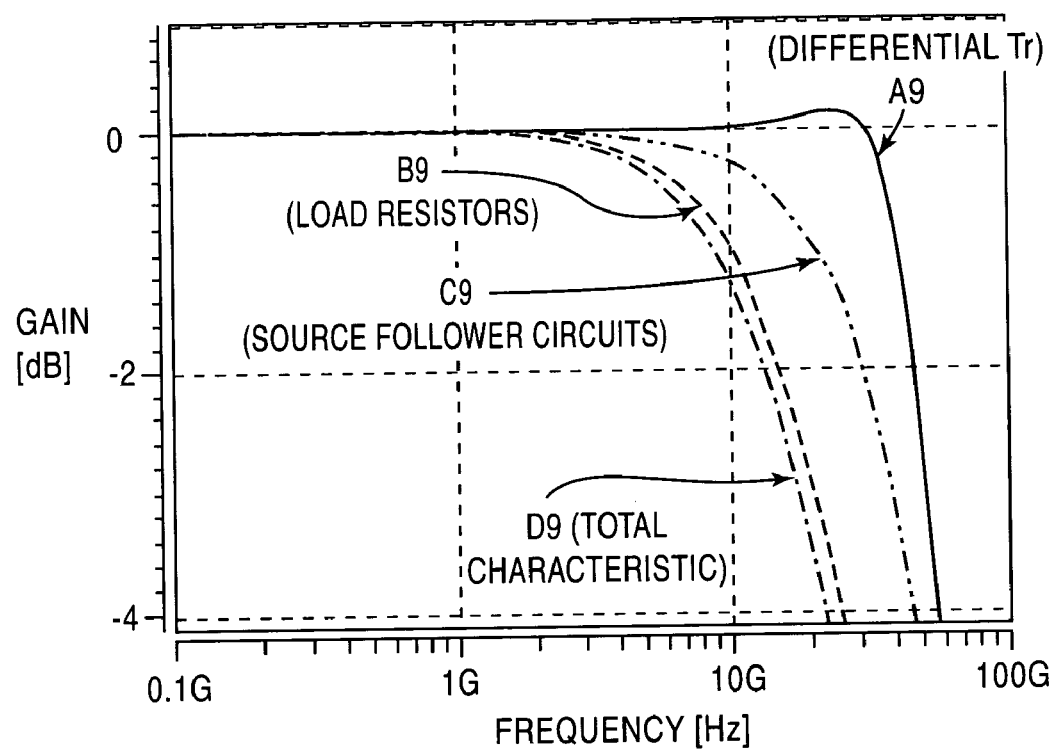
FIG. 15 is a frequency characteristic diagram for the differential amplifying circuit of FIG. 12, with inductance of the inductors 31, 32 of FIG. 12 being about 0.55 nH.

FIG. 15 is a frequency characteristic diagram for the differential amplifying circuit of FIG. 12, with inductance of each of the inductors 31, 32 of FIG. 12 being about 0.55 nH. A gain of lower frequency is set to be a normalized value (0 dB) in FIG. 15. In FIG. 15, A9 is the frequency characteristic of the differential transistors 10, 11 of FIG. 12; B9 is the frequency characteristic of the load resistors 14, 15 of FIG. 12 viewed from the drains of the gate grounded transistors 12, 13 of FIG. 12; C9 is the frequency characteristic of the source follower circuits 29, 30 of FIG. 12; and D9 is the total frequency characteristic of the differential amplifying circuit 300 of FIG. 12.

Figure 16:
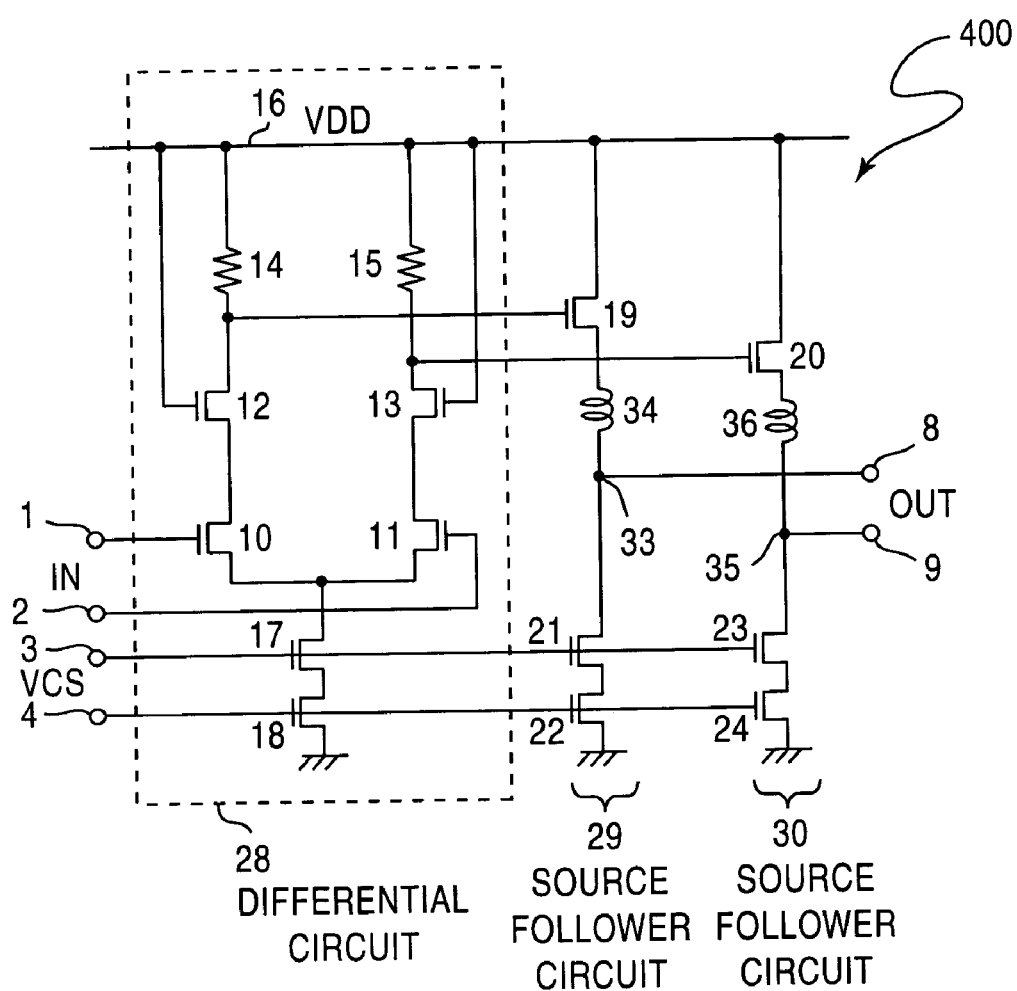
FIG. 16 shows a circuit diagram of a differential amplifying circuit, in which inductors are inserted only between the source of the source follower transistor and an output terminal, for determining circuit structure, in accordance with an embodiment of the present invention.

FIG. 16 is a circuit diagram of a differential amplifying circuit 400, in which inductors 34, 36 are inserted only between the source of the source follower transistor 34, 36 and an output terminal 8, 9.

Figure 17:
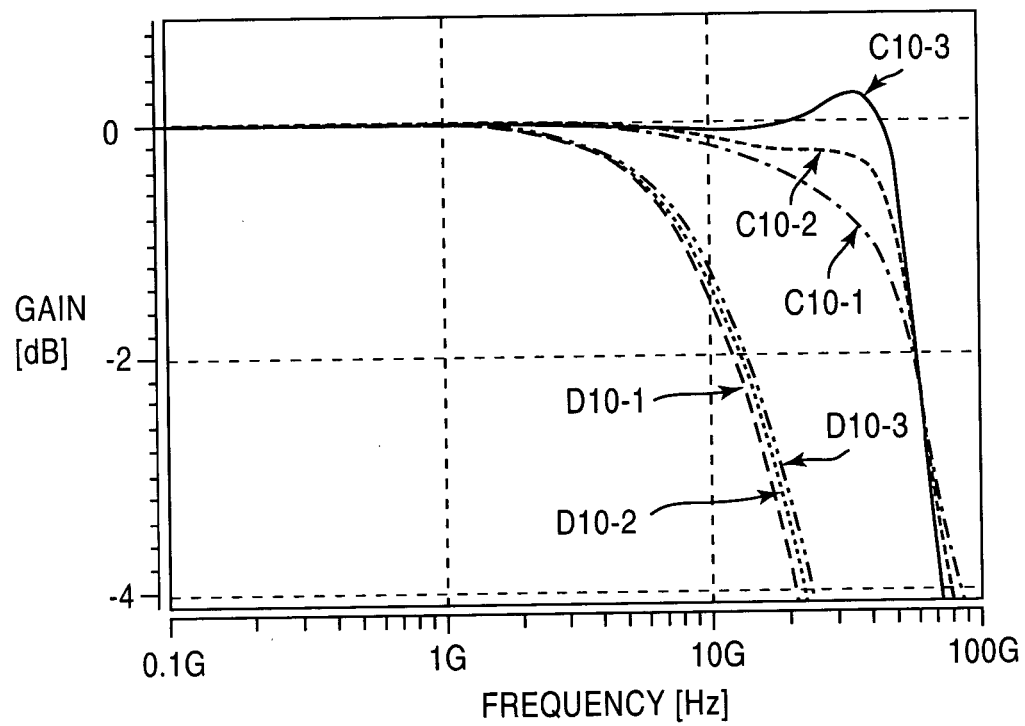
FIG. 17 is a frequency characteristic diagram for the differential amplifying circuit of FIG. 16, with inductance of the inductors 34, 36 of FIG. 16 being varied.

FIG. 17 is a frequency characteristic diagram for the differential amplifying circuit 400 of FIG. 16, inductance of each of the inductors 34, 36 of FIG. 16 being varied. A gain of lower frequency is set to be a normalized value (0 dB) in FIG. 17. In FIG. 17, C10-1, C10-2, C10-3 are frequency characteristics of the source follower circuits 29, 30 of FIG. 16. C10-1 is the characteristic when the inductance of each of the inductors 34, 36 of FIG. 16 is about 0.1 nH; C10-2 is the characteristic when the inductance of each is about 0.15 nH; and C10-3 is the characteristic when the inductance of each is about 0.2 nH.

Moreover, D10-1, D10-2, D10-3 are total characteristics of the differential amplifying circuit 400 of FIG. 16 as a whole. D10-1 is the characteristic when inductance of each of the inductors 34, 36 of FIG. 16 is about 0.1 nH; D10-2 is the characteristic when inductance of each is about 0.15 nH; and D10-3 is the characteristic when inductance of each is about 0.2 nH.

Figure 18:
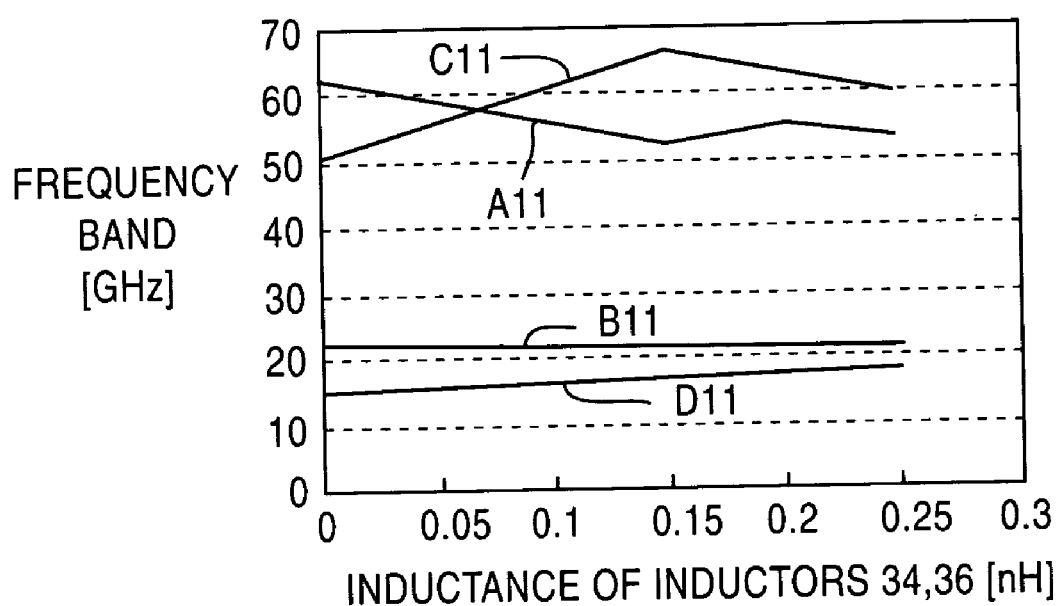
FIG. 18 is a diagram illustrating the relationship between inductance of inductors 34, 36 of FIG. 16 and frequency bandwidth for the differential amplifying circuit of FIG. 16.

FIG. 18 is a diagram illustrating the relationship between inductance of inductors 34, 36 of FIG. 16 and frequency bandwidth for the differential amplifying circuit 400 of FIG. 16. In FIG. 18, A11 is the bandwidth of the differential amplifying transistors 10, 11 of FIG. 16; B11 is the bandwidth of the load resistors 14, 15 of FIG. 16 viewed from the drains of the gate grounded transistors 12, 13 of FIG. 16; C11 is the bandwidth of the source follower circuits 29, 30 of FIG. 16; and D11 is the total bandwidth of the differential amplifying circuit 400 of FIG. 16.

As shown in FIG. 18, the effect of the insertion of the inductors 34, 35 of FIG. 16 tends to extend the bandwidth of the inductors 34, 35 of FIG. 16 within the range of about 0.1 to 0.2 nH in the inductance.

Figure 19:
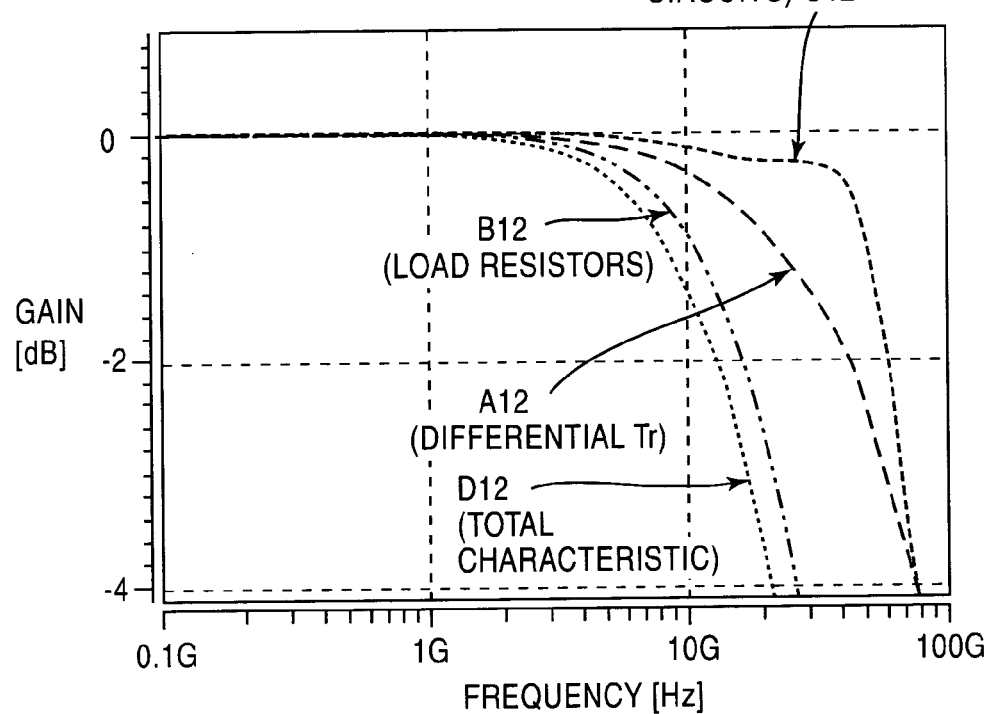
FIG. 19 is a frequency characteristic diagram for the differential amplifying circuit of FIG. 16, with inductance of the inductors 34, 36 of FIG. 16 being about 0.15 nH.

FIG. 19 is a frequency characteristic diagram for the differential amplifying circuit of FIG. 16, with inductance of each of the inductors 34, 36 of FIG. 16 being about 0.15 nH. A gain of lower frequency is set to be a normalized value (0 dB) in FIG. 19. In FIG. 19, A12 is the frequency characteristic of the differential amplifying transistors 10, 11 of FIG. 16; B12 is the frequency characteristic of the load resistors 14, 15 of FIG. 16 viewed from the drains of the gate grounded transistors 12, 13 of FIG. 16; C13 is the frequency characteristic of the source follower circuits 29, 30 of FIG. 16; and D12 is the total frequency characteristic of the differential amplifying circuit 400 of FIG. 16.

As described above, the optimum value of the inductance of each of the inductors 26, 27 of FIG. 5 is about 1 nH or less, while the optimum value of each of the inductance of the inductors 31, 32 of FIG. 5 is between about 0.4 and 0.6 nH, and the optimum value of the inductance of each of the inductors 34, 36 of FIG. 5 is between about 0.1 and 0.2 nH. For example, when the inductance of inductors 26, 27 of FIG. 5 is about 0.8 nH, inductance of inductors 31, 32 of FIG. 5 is about 0.55 nH and inductance of inductors 34, 36 of FIG. 5 is about 0.15 nH, the frequency characteristic of FIG. 6 is attained and the bandwidth can be extended up to about 34.8 GHz (bandwidth is 14.8 GHz in the related art differential amplifying circuit 1 of FIG. 1).

As described above, as shown in FIG. 5, according to one embodiment of the present invention, the first inductors 31, 32 are located between the drain of the differential transistors 10, 11 and the source of the gate grounded transistors 12, 13, the second inductors 26, 27 are located between the load resistors 14, 15 and the power supply line 16, and the third inductors 34, 36 are located between the source of the source follower transistors 19, 20 and the differential signal output terminals 8, 9.

As a result, as shown in FIG. 6, the peaking characteristic owing to the inductors occurs with the frequency characteristic A3 of the differential transistors 10, 11 of FIG. 5, the characteristic B3 of the load resistors 14, 15 of FIG. 5, and the characteristic C3 of the source follower circuits 29, 30 of FIG. 5, and thereby the total frequency band characteristic can also be extended toward the high frequency region by the inductor peaking. As a result, frequency band characteristic wider than that of the related art can be attained.

Moreover, the inductance values of inductors 26, 27 of FIG. 5 can be set so as to lower the cut-off frequency of the load resistors 14, 15 of FIG. 5 relative to that of the differential transistors 10, 11 of FIG. 5 and that of the source follower circuits 29, 30 of FIG. 5. In this embodiment, as shown in FIG. 6, since the total frequency band characteristic D3 is restricted as a function of the frequency band characteristic B3 of the load resistors 14, 15 of FIG. 5, the total frequency band characteristic D3 does not easily vary due to fluctuation in the characteristics of differential transistors 10, 11 and the source follower transistors 19, 20 of FIG. 5.

Figure 20:
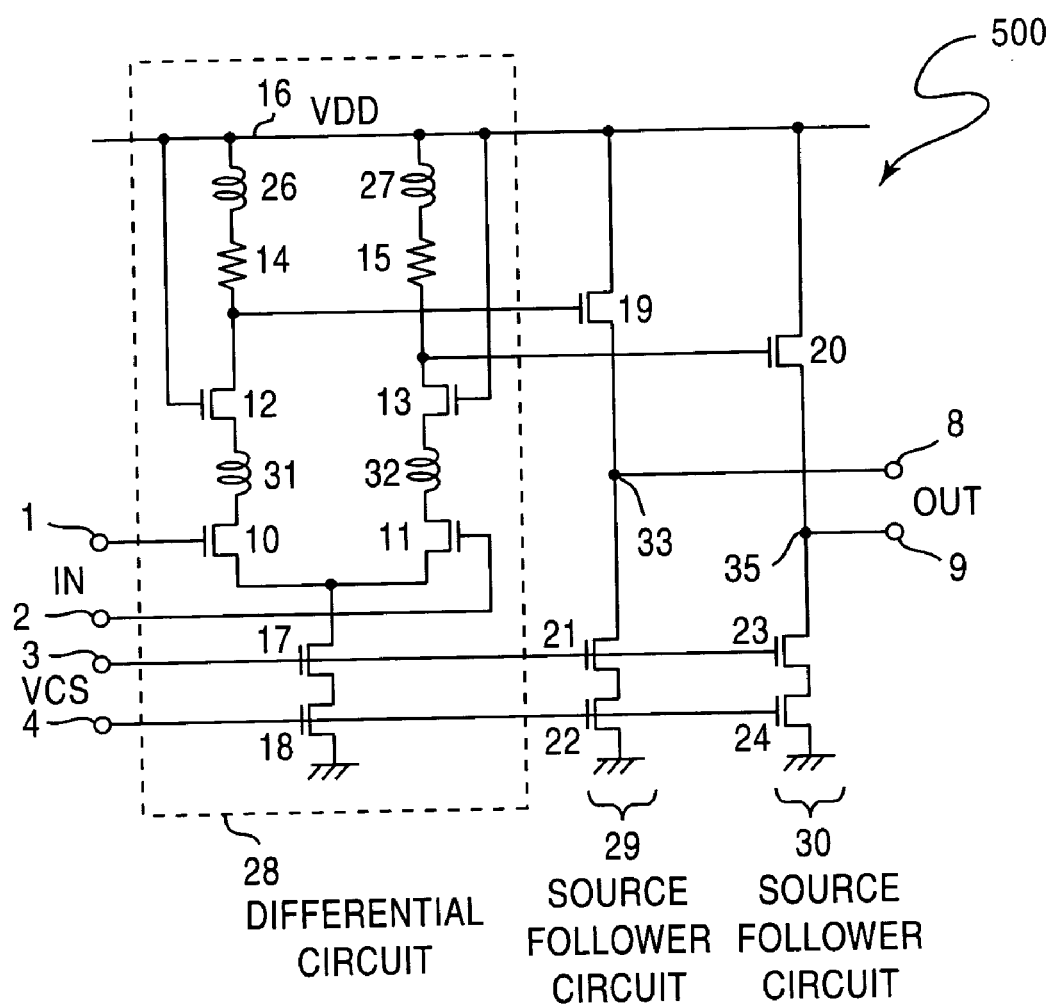
FIG. 20 shows a circuit diagram of another differential amplifying circuit, in accordance with an embodiment of the present invention.

In one embodiment of the present invention, as shown in FIG. 5, the inductors 26, 27, 31, 32, 34, 36 are located as indicated; however, it is also possible to utilize only the inductors 26, 27, 31, 32 as shown in FIG. 20. With the circuit of the embodiment of FIG. 20, the desired frequency band can also be extended.

As shown in FIG. 20, the differential amplifying circuit 500 includes inductors 31, 32 located between the drain of the differential transistors 10, 11 and the source of the gate grounded transistors 12, 13, and inductors 26, 27 located between the load resistors 14, 15 and the power supply line 16.

In the embodiment of FIG. 20, it is preferable to set the inductance values of the inductors 26 and 27 so as to lower the cut-off frequency associated with the load resistors 14, 15 relative to that of the differential transistors 10, 11. In this embodiment, the total frequency band characteristic is limited by the frequency band characteristic of the load resistors 14, 15, and the total frequency band characteristic is not limited by the frequency band characteristic of the differential transistors 10, 11. Therefore, the total frequency band characteristic does not easily vary due to fluctuation in the characteristics of the differential transistors 10, 11.

Moreover, in the embodiment of FIG. 20, it is also preferable that the gate widths of the gate grounded transistors 12, 13 be set such that the cut-off frequency of the load resistors 14, 15 is lower than that of the differential transistors 10, 11, in order to extend the frequency band observed from the drain of the differential transistors 10, 11 by lowering the resistance values of the gate grounded transistors 12, 13, which is determined with inductors 31 and 32 assumed to be absent from the circuit 500.

Figure 21:
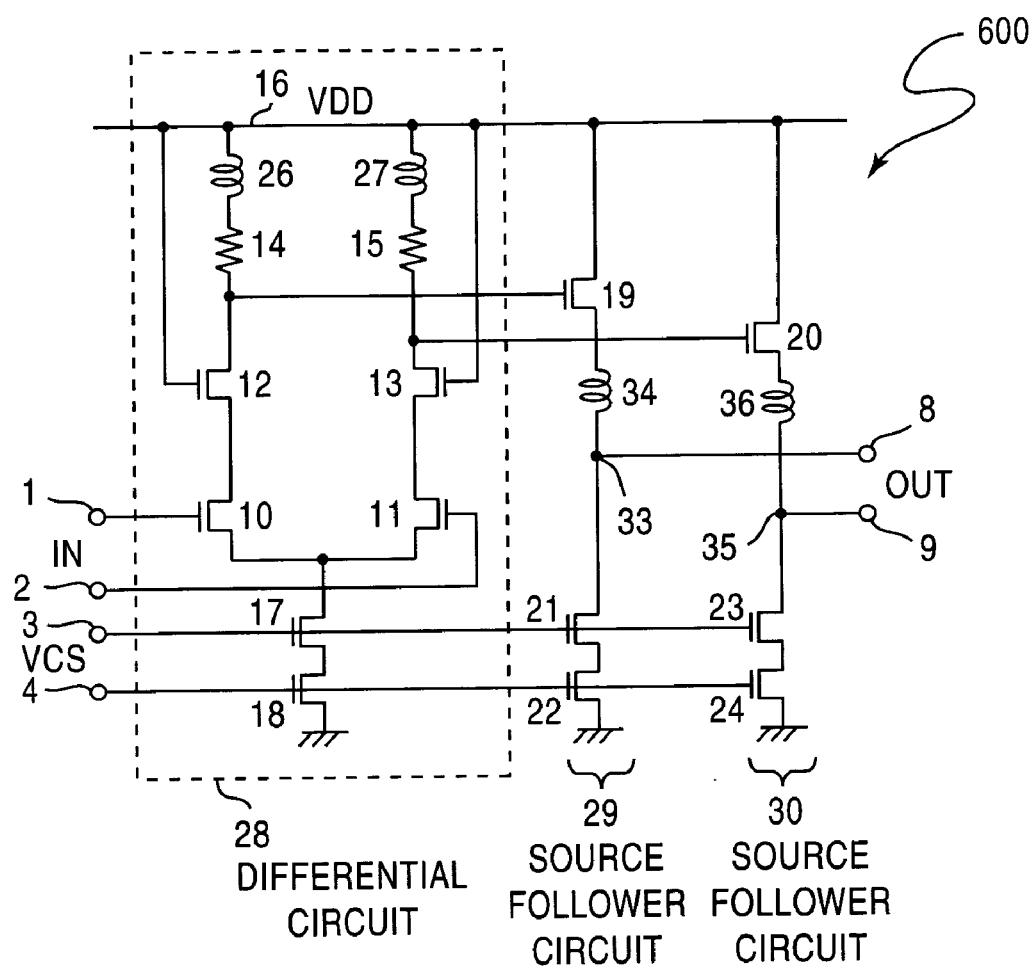
FIG. 21 shows a circuit diagram of another differential amplifying circuit, in accordance with an embodiment of the present invention.

Moreover, it is also possible to locate only the inductors 26, 27, 34, 36 as shown in FIG. 21. Thereby, the frequency band can also be extended.

FIG. 21 shows a circuit diagram of another differential amplifying circuit 600, in accordance with an embodiment of the present invention, in which the first inductors 26, 27 are located between the load resistors 14, 15 and the power supply line 16, and the second inductors 34, 36 are located between the source of the source follower transistors 19, 20 and the differential signal output terminals 8, 9.

In the embodiment of FIG. 21, it is preferable to set the inductance values of the inductors 26 and 27 so as to lower the cut-off frequency associated with the load resistors 14, 15 relative to that of the source follower circuits 29, 30. In this embodiment, the total frequency band characteristic is limited by the frequency band characteristic of the load resistors 14, 15, and the total frequency band characteristic is not limited by the frequency band characteristic of the source follower circuits 29, 30. Therefore the total frequency band characteristic does not easily vary due to fluctuation in the characteristics of the differential transistors 10, 11.

Moreover, in the embodiment of FIG. 21, it is also preferable that the gate widths of the gate grounded transistors 12, 13 of FIG. 21 be set such that the cut-off frequency of the load resistors 14, 15 is lower than that of the source follower circuits 29, 30, in order to extend the frequency band observed from the drain of the differential transistors 10, 11 by lowering the resistance values of the gate grounded transistors 12, 13, which is determined with inductors 34 and 36 assumed to be absent from the circuit 600.

Figure 22:
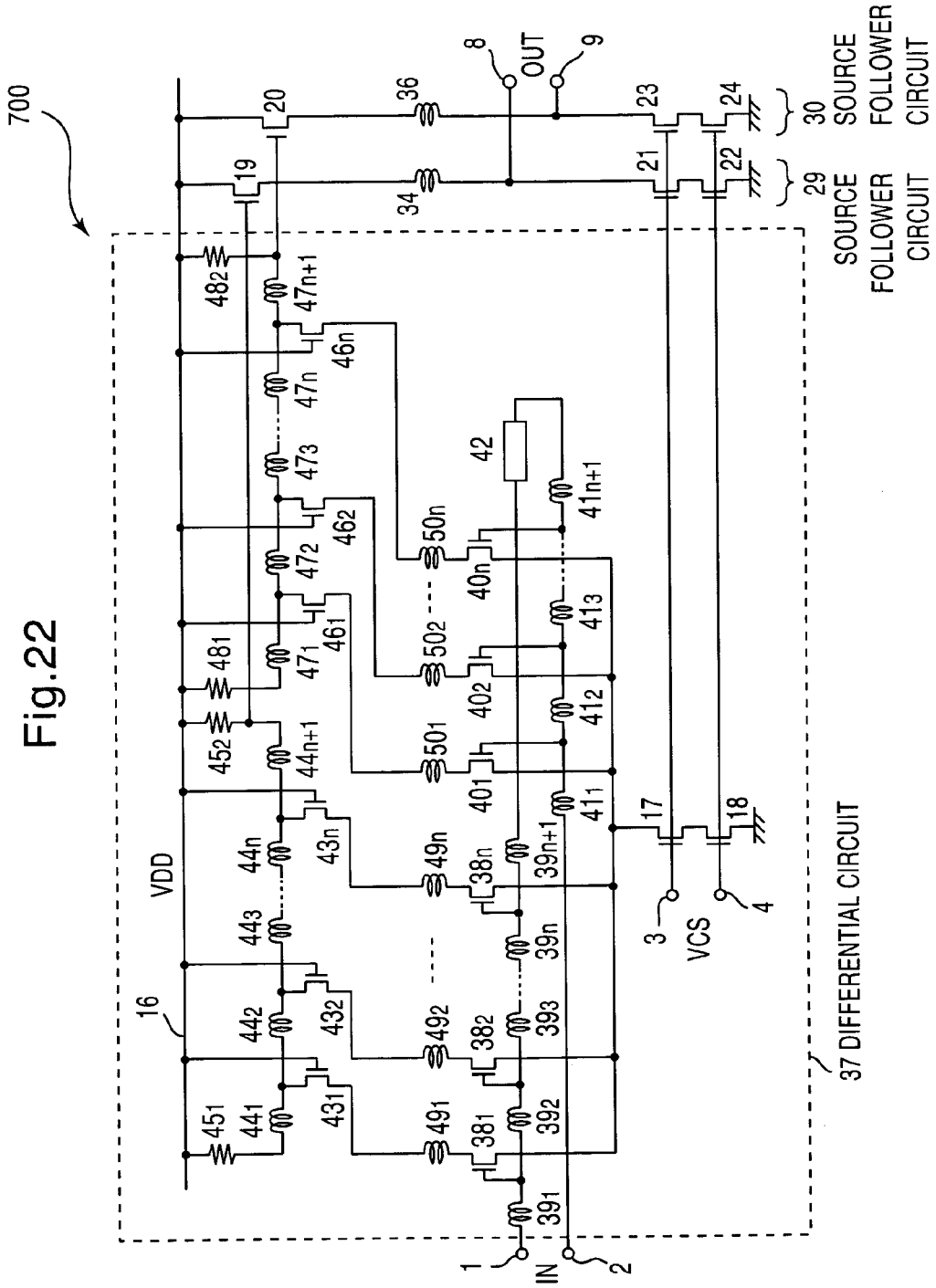
FIG. 22 shows a circuit diagram of a differential amplifying circuit in accordance with another embodiment of the present invention.

FIG. 22 is a circuit diagram of yet another embodiment of the present invention. The differential amplifying circuit 700 shown in FIG. 22 has a differential circuit 37. The differential circuit 37 of FIG. 22 is structured similarly to that of the differential circuit 28 of FIG. 5, except that the structure of the differential transistors 10, 11, gate grounded transistors 12, 13, the load resistors 14, 15, and the inductors 26, 27, 31, 32 included in the differential circuit 28 of FIG. 5 are formed in FIG. 22 as distributed constant circuits.

In the differential circuit 37, differential transistors 381, 382, . . . , 38n are provided corresponding to the differential transistor 10 of FIG. 5; inductors 391 . . . 39n+1 and 411 . . . 41n+1 are a distributed inductance on lines 1 and 2, respectively; differential transistors 401, 402, . . . , 40n are provided corresponding to the differential transistor 11 of FIG. 5; the element numbered 42 is a terminator; gate grounded transistors 431, 432, . . . , 43n are provided corresponding to the gate grounded transistor 12 of FIG. 5; inductors 441, 442, . . . , 44n+1 are provided as distributed inductance corresponding to the inductor 26 of FIG. 5; load resistors 451, 452 are provided corresponding to the load resistor 14 of FIG. 5; gate grounded transistors 461, 462, . . . , 46n are provided corresponding to the gate grounded transistor 13 of FIG. 5; inductors 471, 472, . . . , 47n are provided corresponding to the inductor 27 of FIG. 5; load resistors 481, 482 are provided corresponding to the load resistor 15 of FIG. 5; inductors 491, 492, . . . , 49n are provided corresponding to the inductor 31 of FIG. 5; and inductors 501, 502, . . . , 50n are provided corresponding to the inductor 32 of FIG. 5.

According to this embodiment of the present invention, since the capacitances in the drain side of the differential transistors 381, 382, . . . , 38n, 401, 402, . . . , 40n can be omitted, the frequency band of the differential transistors 381, 382, . . . , 38n, 401, 402, . . . , 40n can be extended, and moreover the frequency band of the load resistors 451, 452, 481, 482 can also be extended. In addition, the frequency band of the source follower circuits 29, 30 can be extended with the inductors 34, 36. Accordingly, the total frequency band can be extended, and the frequency band characteristic wider than that of the related art can also be attained.

It is also possible to insert only the inductors 491, 492, . . . , 49n, 501, 502, . . . , 50n or to insert only the inductors 34, 36. Thereby, the frequency band can also be extended.

Example embodiments of the present invention have now been described in accordance with the above advantages. It will be appreciated that these examples are merely illustrative of the invention. Many variations and modifications will be apparent to those skilled in the art.

What is claimed is:

1. A differential amplifier, comprising:
a differential transistor;
a first inductor having a first end and a second end, the first end being connected to a drain of said differential transistor;
a gate grounded transistor having a source connected to the second end of said first inductor;

a load resistor having a first end and a second end, the first end being connected to a drain of said gate grounded transistor;

a second inductor connected between the second end of said load resistor and a power supply;

a source follower transistor having a gate connected to the drain of said gate grounded transistor; and a third inductor connected between a source of said source follower transistor and an output terminal.

2. The differential amplifier according to claim 1, wherein a cut-off frequency of said load resistor is lower than that of said differential transistor and that of said source follower transistor.

3. The differential amplifier according to claim 1, wherein a gate width of said gate grounded transistor is set to the width such that the cut-off frequency of said load resistor is lower than that of said differential transistor and that of said source follower transistor even when inductances of said first and third inductors are at or near zero.

4. The differential amplifier according to claim 1, 2 or 3, wherein said first inductor has an inductance between about 0.4 and 0.6 nH, wherein said second inductor has an inductance about equal to or less than 1 nH, and wherein said third inductor has an inductance between about 0.1 and 0.2 nH.

5. The differential amplifier according to claim 1, 2 or 3, wherein said differential transistor, said first inductor, said gate grounded transistor, said load resistor and said second inductor are formed as distributed constant circuits.

6. A differential amplifier, comprising:

a differential transistor;

a first inductor having a first end and a second end, the first end being connected to a drain of said differential transistor;

a gate grounded transistor having a source connected to the second end of said first inductor;

a load resistor having a first end and a second end, the first end being connected to a drain of said gate grounded transistor;

a second inductor connected between the second end of said load resistor and a power supply; and a source follower transistor having a gate connected to the drain of said gate grounded transistor, and a source connected to an output terminal.

7. The differential amplifier according to claim 6, wherein a cut-off frequency of said load resistor is lower than that of said differential transistor.

8. The differential amplifier according to claim 6, wherein a gate width of said gate grounded transistor is set to the width such that the cut-off frequency of said load resistor is lower than that of said differential transistor even when an inductance of said first inductor is at or near zero.

9. The differential amplifier according to claim 6, 7 or 8, wherein said first inductor has an inductance between about 0.4 and 0.6 nH, and wherein said second inductor has an inductance about equal to or less than 1 nH.

10. The differential amplifier according to claim 6, 7 or 8, wherein said differential transistor, said first inductor, said gate grounded transistor, said load resistor and said second inductor are formed as distributed constant circuits.

11. A differential amplifier, comprising:

a differential transistor;

a gate grounded transistor having a source connected to a drain of said differential transistor;

a load resistor having a first end and a second end, the first end being connected to a drain of said gate grounded transistor;

a first inductor connected between the second end of said load resistor and a power supply;

a source follower transistor having a gate connected to the drain of said gate grounded transistor; and a second inductor connected between a source of said source follower transistor and an output terminal.

12. The differential amplifier according to claim 11, wherein a cut-off frequency of said load resistor is lower than that of said source follower transistor.

13. The differential amplifier according to claim 11, wherein a gate width of said gate grounded transistor is set to the width which makes the cut-off frequency of said load resistor lower than that of said source follower transistor even when an inductance of said second inductor is zero.

14. The differential amplifier according to claim 11, 12 or 13, wherein an inductance of said first inductor is about equal to or less than 1 nH, and an inductance of said second inductor is between about 0.1 and 0.2 nH.

15. The differential amplifier according to claim 11, 12 or 13, wherein said differential transistor, said gate grounded transistor, said load resistor and said first inductor are formed as distributed constant circuits.

* * * * *